United States Patent
Fogel et al.

(10) Patent No.: US 9,601,482 B1
(45) Date of Patent: Mar. 21, 2017

(54) ECONOMICAL AND ENVIRONMENTALLY FRIENDLY CHEMICAL MECHANICAL POLISHING FOR III-V COMPOUND SEMICONDUCTOR DEVICE FABRICATION

(71) Applicant: International Business Machines Corporation, Armonk, NY (US)

(72) Inventors: Keith E. Fogel, Hopewell Junction, NY (US); Alexander Reznicek, Troy, NY (US); Devendra K. Sadana, Pleasantville, NY (US); Charan V. Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/962,012

(22) Filed: Dec. 8, 2015

(51) Int. Cl.
  *H01L 29/78* (2006.01)
  *H01L 27/06* (2006.01)
  *H01L 21/762* (2006.01)
  *H01L 21/8234* (2006.01)
  *H01L 21/306* (2006.01)
  *H01L 21/02* (2006.01)
  *H01L 29/06* (2006.01)
  *H01L 29/20* (2006.01)

(52) U.S. Cl.
  CPC .... *H01L 27/0629* (2013.01); *H01L 21/02546* (2013.01); *H01L 21/30625* (2013.01); *H01L 21/762* (2013.01); *H01L 21/823431* (2013.01); *H01L 21/823481* (2013.01); *H01L 27/0605* (2013.01); *H01L 29/0649* (2013.01); *H01L 29/20* (2013.01); *H01L 29/7851* (2013.01)

(58) Field of Classification Search
  None
  See application file for complete search history.

(56) References Cited

U.S. PATENT DOCUMENTS

| | | | |
|---|---|---|---|
| 8,173,551 B2 | 5/2012 | Bai et al. | |
| 8,937,299 B2 | 1/2015 | Basu et al. | |
| 9,064,698 B1 | 6/2015 | Khakifirooz et al. | |
| 2008/0070355 A1 | 3/2008 | Lochtefeld et al. | |
| 2010/0301391 A1 | 12/2010 | Lochtefeld | |
| 2011/0062492 A1 | 3/2011 | Ko et al. | |
| 2014/0235030 A1* | 8/2014 | Disney | H01L 21/2654 438/418 |
| 2014/0264607 A1* | 9/2014 | Basu | H01L 29/785 257/365 |
| 2015/0221735 A1 | 8/2015 | Joshi et al. | |

* cited by examiner

*Primary Examiner* — Johannes P Mondt
(74) *Attorney, Agent, or Firm* — Vazken Alexanian; Ryan, Mason & Lewis, LLP

(57) ABSTRACT

Compound semiconductor devices and methods for fabricating compound semiconductor devices (e.g., III-V devices) based on aspect ratio trapping are provided in which economical and environmentally friendly chemical mechanical polishing techniques are implemented to minimize waste of, e.g., III-V precursor material, minimize production costs, and minimize environmental impact from toxic waste generated from chemical mechanical polishing of III-V films.

20 Claims, 5 Drawing Sheets

US 9,601,482 B1

ECONOMICAL AND ENVIRONMENTALLY FRIENDLY CHEMICAL MECHANICAL POLISHING FOR III-V COMPOUND SEMICONDUCTOR DEVICE FABRICATION

TECHNICAL FIELD

This disclosure generally relates to semiconductor fabrication techniques and, in particular, chemical mechanical polishing techniques for use in the fabrication of compound semiconductor devices.

BACKGROUND

While advances in silicon (Si) technology continue to revolutionize the development of micro and nano electronics, the semiconductor industry is conducting significant research in the heterogeneous integration of compound semiconductors with Si substrates for the development of high-speed electronic and optoelectronic devices. For example, one class of compound semiconductors referred to as "III-V compound semiconductors" include at least one element from each of Group III and Group V of the periodic table of elements. Examples of III-V compound semiconductors include, but are not limited to, GaAs (Gallium Arsenide), InP (Indium Phosphide), InGaAs (Indium Gallium Arsenide), InAs (Indium Arsenide), GaP (Gallium Phosphide), InSb (Indium Antimonide), GaSb (Gallium Antimonide), GaN (Gallium Nitride), and AlInP (Aluminum Indium Phosphide).

FinFET technology is an emerging semiconductor technology being developed to provide effective scaling solutions for field effect transistor (FET) fabrication at, and below, the 22 nm node, using heterogeneous integration of compound semiconductors. FinFET structures include one or more narrow semiconductor fin structures, wherein each semiconductor fin structure is gated on at least two sides thereof. The semiconductor fin structures of FinFET devices can be formed by growing III-V compound semiconductors on silicon substrates using ART (aspect ratio trapping) techniques. ART enables selective epitaxy of III-V compound semiconductor material to fill high aspect ratio trenches formed in an insulating layer, to thereby form high quality active channel layers of III-V material for FinFET devices. Indeed, the high aspect ratio trenches serve to trap threading dislocations at the bottom of the trenches during epitaxial growth, thereby reducing the dislocation density of lattice mismatched compound semiconductor materials (e.g., III-V materials) grown on silicon.

ART requires a CMP (chemical and mechanical polishing) step to etch away excess epitaxial material which results from the ART process and produce smooth surface morphologies. However, these techniques are uneconomical as there is a significant amount of costly precursor material (e.g., III-V material) used to overgrow the epitaxial layers to facilitate CMP, which is ultimately etched away via the CMP process and wasted. Moreover, compound semiconductor materials such as III-V materials include toxic materials (e.g., arsenic). Therefore, conventional methods that use CMP to etch away excess epitaxial III-V material, for example, result in the generator of toxic gases and waste (e.g., arsenic in waste water), which is environmentally unfriendly.

SUMMARY

Embodiments of the invention generally include semiconductor fabrication techniques and, in particular, chemical mechanical polishing techniques for use in the fabrication of compound semiconductor devices based on aspect ratio trapping.

For example, one embodiment of the invention includes a method to fabricate a semiconductor device. The method includes forming an insulating layer on a semiconductor substrate, wherein the insulating layer comprises a trench and an open region formed in the insulating layer down to the semiconductor substrate. An epitaxial deposition process is performed to deposit compound semiconductor material in the trench and the open region of the insulating layer. The epitaxial deposition process is terminated at some point in the deposition process when the trench is over filled with the compound semiconductor material protruding from the trench past a surface of the insulating layer, and the open region is partially filled with the compound semiconductor material. A layer of sacrificial material is deposited on the surface of the insulating layer to cover the compound semiconductor material protruding from the trench and to fill a remaining portion of the open region with the sacrificial material. A chemical mechanical polishing process is performed to form a planarized surface by removing the excess sacrificial material on the surface of the insulating layer and removing the excess compound semiconductor material protruding from the trench.

Another embodiment of the invention includes a semiconductor device. The semiconductor device includes an insulating layer disposed on a semiconductor substrate, wherein the insulating layer comprises a trench and an open region formed in the insulating layer down to the semiconductor substrate. The trench is filled with III-V compound semiconductor material that forms a fin structure of an FET (field effect transistor) device. One end of the fin structure contacts the semiconductor substrate and another end of the fin structure extends past a surface of the insulating layer to provide an active fin component of the FET device formed on the surface of the insulating layer. A bottom portion of the open region is filled with III-V compound semiconductor material in contact with the semiconductor substrate, and an upper portion of the open region is filled with a sacrificial material which comprises a non-III-V semiconductor material. The III-V compound semiconductor materials in the trench and the open region of the insulating layer are the same.

Other embodiments will be described in the following detailed description of embodiments, which is to be read in conjunction with the accompanying figures.

DETAILED DESCRIPTION OF EMBODIMENTS

Embodiments of the invention will now be discussed in further detail with regard to methods for fabricating compound semiconductor devices (e.g., III-V devices) based on aspect ratio trapping, in which economical and environmentally friendly chemical mechanical polishing techniques are implemented to minimize waste of, e.g., III-V precursor material, minimize production costs, and minimize environmental impact from toxic waste generated from chemical mechanical polishing of III-V films.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
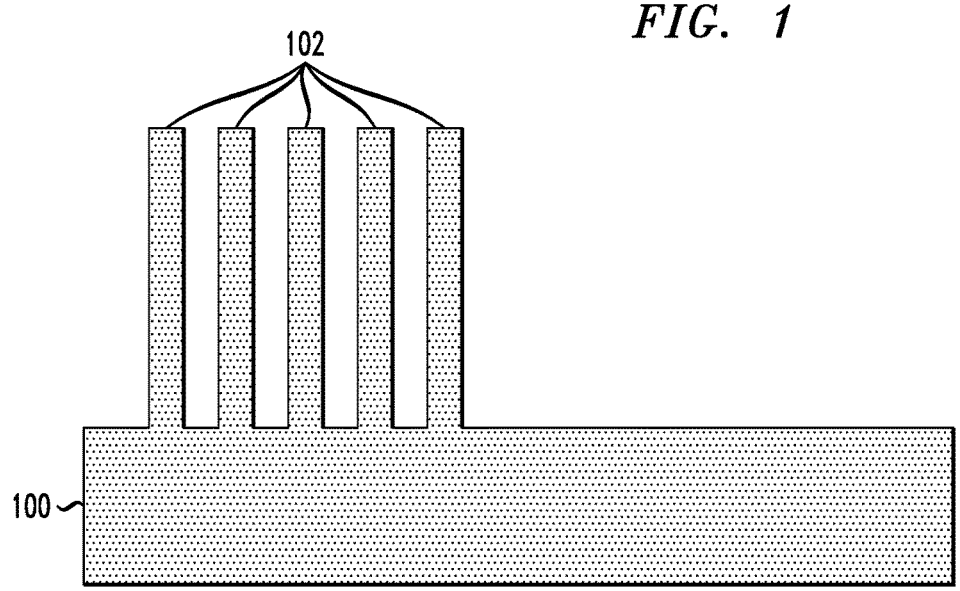
FIG. 1 is cross-sectional schematic view of a semiconductor device at an initial stage of fabrication starting with a semiconductor substrate comprising a plurality of semiconductor fin structures formed thereon, according to an embodiment of the invention.

Methods for fabricating semiconductor devices comprising FinFET structures will now be discussed in further detail with initial reference to FIG. 1, which shows a cross-sectional schematic view of a semiconductor device at an initial stage of fabrication starting with a semiconductor substrate 100 comprising a plurality of semiconductor fin structures 102 formed thereon, according to an embodiment of the invention. In one embodiment of the invention, the semiconductor substrate 100 comprises a bulk substrate that is made from any of several known semiconductor materials such as, for example, silicon, germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. The thickness of the substrate 100 will vary depending on the application. In another embodiment, the substrate 100 may comprise a SOI (silicon on insulator substrate).

The plurality of semiconductor fin structures 102 can be formed using known techniques. For example, the semiconductor fin structures 102 can be constructed by forming an etch mask on a surface of the semiconductor substrate 100, and then performing a DRIE (deep reactive ion etch) process, for example, using the etch mask to etch exposed portions of the semiconductor substrate 100 and form the semiconductor fin structures 102. Other highly anisotropic etch techniques may be implemented to form the semiconductor fin structures 102 with steep-sided walls.

Figure 2:
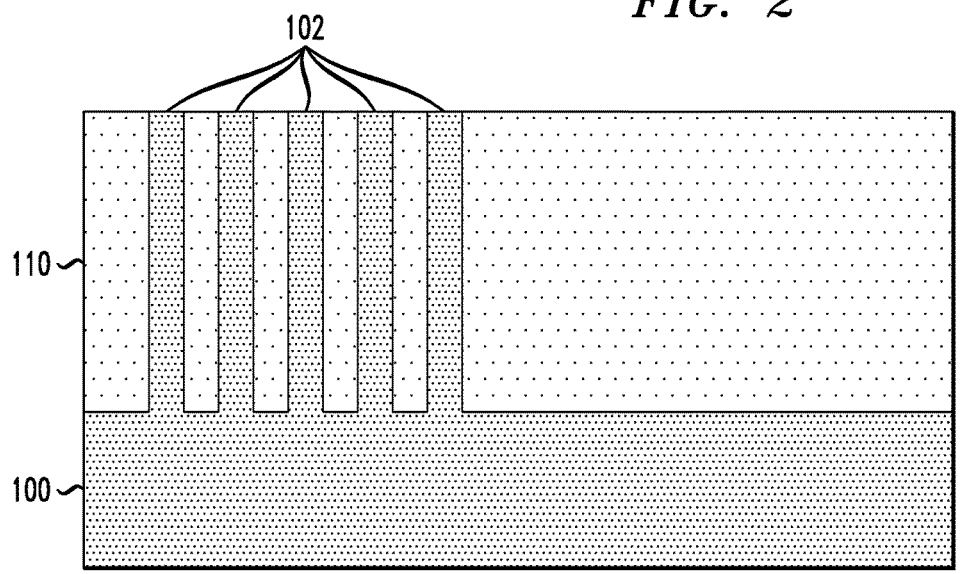
FIG. 2 is cross-sectional schematic view of the semiconductor device of FIG. 1 after forming an insulating layer on the silicon substrate, according to an embodiment of the invention.

A next step in the fabrication process comprises forming a layer of insulating material on the semiconductor substrate 100 to encapsulate the semiconductor fin structures 102. For example, FIG. 2 is cross-sectional schematic view of the semiconductor device of FIG. 1 after forming an insulating layer 110 on the substrate 100, according to an embodiment of the invention. The semiconductor structure shown in FIG. 2 can be fabricated by blanket depositing a layer of insulating material over the surface of the substrate 100 to fill in the spaces between the semiconductor fin structures 102 and cover the semiconductor fin structures 102 with insulating material. The insulating layer 110 can be formed of an oxide material (e.g., $SiO_2$, $Al_2O_3$, etc.) or a nitride material (e.g., SiN, SiON, etc.). The insulating layer 110 may be formed using known deposition techniques such as CVD (chemical vapor deposition), PVD (physical vapor deposition) and other suitable techniques. A CMP (chemical mechanical polish) process is then performed to remove the excess insulating material and planarize surface of the insulating layer 110 down to the upper surfaces of the semiconductor fin structures 102, as shown in FIG. 2.

Figure 3A:
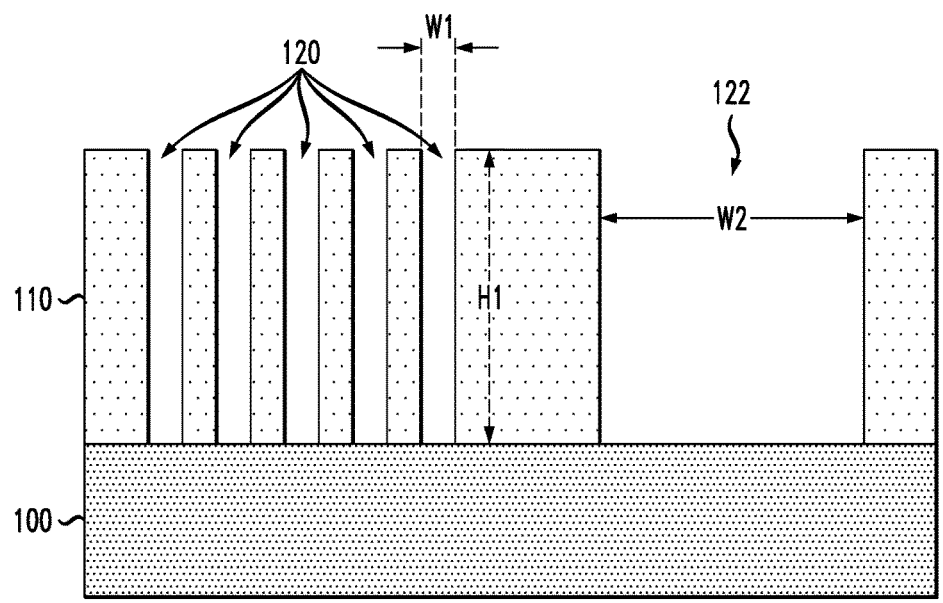
FIGS. 3A and 3B schematically illustrate the semiconductor device of FIG. 2 after removing the semiconductor fin structures to form trenches in the insulating layer and etching other openings in the insulating layer down to the silicon substrate, according to an embodiment of the invention.
Figure 3B:
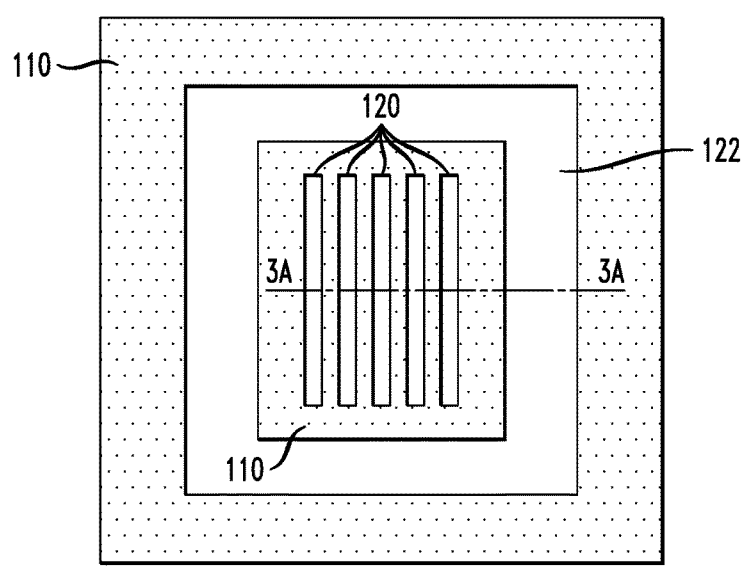

Referring now to FIGS. 3A and 3B, the fabrication process continues with removing the semiconductor fin structures 102 to form trenches in the insulating layer and etching other openings in the insulating layer down to the semiconductor substrate 100. For example, FIG. 3A is a cross-sectional schematic view of the semiconductor device of FIG. 2 after etching away the semiconductor fin structures 102 to form trenches 120 in the insulating layer 100, and etching another region of the insulating layer 110 to form an open region 122 in the insulating layer 110 down to the semiconductor substrate 100. The trenches 120 that are formed by removing the semiconductor fin structures 102 comprise "high aspect ratio" trenches 120 which are subsequently filled with epitaxial compound semiconductor material to fabricate compound semiconductor fin structures for FinFET devices.

As is known in the art, the "aspect ratio" of a trench is defined as the ratio between the height H and the width W of the trench. In one embodiment of the invention, the trenches 120 (which have a width W1 and height H1) are formed with an aspect ratio of about 1:3 or greater. More specifically, in one embodiment of the invention, the trenches 120 are formed with a width W1 in a range of about 8 nm to about 20 nm, and a height H1 in a range of about 100 nm to about 150 nm. In addition, the trenches 120 are spaced with a pitch in a range of about 20 nm to about 200 nm.

The open region 122 has a width W2 that is greater than the width W1 of the trenches 120. The open region 122 is an opening formed in the insulating layer, in which compound semiconductor material is deposited to form other auxiliary devices or structures, such as a high-performance resistor, or an isolator device, etc., depending on the application. The open region 122 has a width W2 in a range of about 200 nm to about 1000 nm, wherein the size of the open region 122 will vary depending on the type of auxiliary device that will be formed in the open region 122 using epitaxial compound semiconductor material.

In one embodiment, the trenches 120 are fabricated by etching away the semiconductor fin structures 102 (e.g., silicon fins) using a suitable etch process such as gas phase etching. For example, when formed of silicon material, the silicon fin structures 102 can be gas phase etched using HCL gas. The open region 122 is fabricated using standard photolithographic etch processes and techniques. For example, a layer of photoresist material is deposited on top of the insulating layer 110 and lithographically patterned (exposed and developed) to form a photoresist mask having a target pattern which defines a corresponding pattern of the open region 122 to be transferred to the insulating layer 110. An etch process (such as ME) is then performed using the photoresist mask to etch exposed portions of the insulating layer 110 down to the substrate 100. The etch process can be performed using a dry etch process such as ME (reactive ion etching) or other anisotropic etch processes with etching chemistries that are suitable to etch the insulating layer 110 down to the semiconductor substrate 100.

FIG. 3B is top plan view of the semiconductor structure shown in FIG. 3A in an embodiment where the open region 122 surrounds the trenches 120 for the purpose of fabrication a guard-ring. In this example embodiment, FIG. 3A would depict is a cross-sectional schematic view of the structure along line 3A-3A in FIG. 3B. As is known in the art, guard ring serves as isolation structure for FinFET devices that are fabricated in later processing steps. The guard ring is formed by depositing semiconductor material in the open region 122, and optionally connecting the guard ring to a power supply node (e.g., VDD or ground) to provide electrical isolation of the FinFET devices that are surrounded by the guard ring. Although the open region 122 shown in FIG. 3B is rectangular shaped, a guard ring may be formed using other patterns or shapes depending on the layout of the components formed on the semiconductor device.

Figure 4:
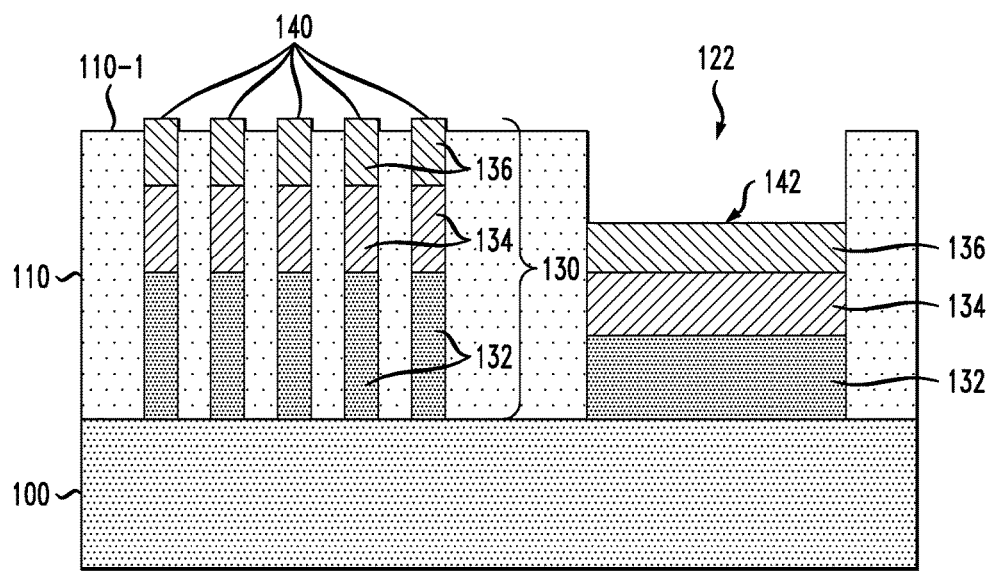
FIG. 4 is a cross-sectional schematic view of the semiconductor device of FIG. 3A after epitaxially growing compound semiconductor material within the trenches and etched opening of the insulating layer, according to an embodiment of the invention.

A next step in the fabrication process comprises epitaxially growing compound semiconductor material in the trenches 120 and the open region 122. For example, FIG. 4 is a cross-sectional schematic view of the semiconductor structure of FIG. 3A after completion of an epitaxy process in which the trenches 120 are completely filled with epitaxially grown compound semiconductor material 130 and the open region 122 is partially filled with epitaxially grown compound semiconductor material 130. In the example embodiment of FIG. 4, the compound semiconductor material 130 comprises different epitaxially grown layers of compound semiconductor material including a first layer 132, a second layer 134, and a third layer 136.

In one embodiment of the invention, the first layer 132, the second layer 134, and the third layer 136 are formed with different III-V compound semiconductor materials. For example, in one embodiment, the first layer 132 comprises GaAs (Gallium Arsenide), the second layer 134 comprises InP (Indium Phosphide), and the third layer 136 comprises InGaAs (Indium Gallium Arsenide). In another embodiment, the second and third layers 134 and 136 may comprise layers of InGaAs with different material concentrations. As discussed in further detail below, the third layer 136 of the compound semiconductor material 130 formed in the trenches 120 provides an active device/channel layer for FinFET devices that are fabricated in later processing steps. As is known in the art, the use of a compound semiconductor material (e.g., III-V compound semiconductor material) provides a higher carrier mobility than silicon and, therefore, allows for the fabrication of high-speed and high-performance semiconductor devices.

In the embodiment of FIG. 4, the epitaxial growth starts on the surface of the semiconductor substrate 100 at the bottom of the trenches 120 and the open region 122 and continues with a bottom-up epitaxial growth of compound semiconductor material. A high-aspect ratio trapping technique is utilized to grow the semiconductor compound material (e.g., III-V material) in the trenches 120. As noted above, ART is employed to create a relatively defect free monocrystalline structure of compound semiconductor material (e.g., III-V material). The ART technique is implemented to improve the quality of III-V heteroepitaxial films that are grown on Si, due to the potential for terminating defects at the sidewalls of the high aspect ratio trenches 120 that enclose the region of epitaxial growth. ART takes advantage of the well-known "necking" effect during growth on patterned substrates where threading dislocations and other defects are confined at the bottom of the trenches 120 leaving the upper portion of the compound semiconductor material 130 defect free for device definition. Defects are suppressed in the lattice of materials at the non-crystalline sidewalls of the insulating layer 110, especially where the sidewalls are relatively high with respect to the growth area. The growth of III-V compound semiconductor material is permitted directly on the surface of the semiconductor substrate 100 even though a lattice-mismatch would normally be present between the Si and the III-V materials (or other materials).

The layers of compound semiconductor material 130 can be epitaxially grown using known techniques, such as CVD (chemical vapor deposition), MOCVD (metal-organic CVD), LPCVD (Low Pressure CVD) or other known epitaxial growth techniques such as, for example, MBE (molecular beam epitaxy). The III-V materials used to fill the trenches 120 and open region 122 may include GaAs, InGaAs, AlInGaAs, AlGaAs, GaP, InGaP, InP, InAs, GaN, GaSb, InSb, etc., combinations of these and alloys thereof. It should be understood that other materials may also be formed instead of III-V compounds, e.g., II-VI compounds, such as ZnO, ZnSe, etc.

In one embodiment of the invention, the first and second layers 132 and 134 provide a multilayer buffer structure that serves multiple purposes. For example, the buffer layer provides a graded buffer structure that serves to effectively match the lattice constant of the material (e.g., silicon) of the semiconductor substrate 100 to the lattice constant of the compound semiconductor material of the third layer 136 (e.g., active device layer). In other words, the first and second layers 132 and 134 serve to minimize mechanical strain that would otherwise exist if the compound semiconductor material layer 136 forming the active device layer was formed directly on the surface of the semiconductor substrate 100 due to the lattice mismatch between the materials of the semiconductor substrate 100 and the third (active device) layer 136.

In this regard, the first layer 132 of the compound semiconductor material 130 is preferably formed of a compound material (e.g., GaAs) that has a lattice constant which is different from, but closely matched to, the lattice constant of the material of the semiconductor substrate 100. Further, the second layer 134 of the compound semiconductor material 130 is preferably formed of a compound material that has a lattice constant which is different from, but closely matched to, the lattice constant of the compound semiconductor material forming the first layer 132, as well as the lattice constant of the compound semiconductor material forming the third layer 136.

In this manner, the first and second layers 132/134 of the compound semiconductor material 130 provides a relaxed buffer structure that serves to minimize mechanical stress resulting from the lattice mismatch between semiconductor substrate 100 and the third layer 136 of the compound semiconductor material 130. This allows for a further reduction in lattice defects of the compound semiconductor material 130 grown in the high aspect ratio trenches 120 in conjunction with the reduction in defects achieved by virtue of ART. In addition, the formation of the multilayer buffer structure enables a reduction in the lattice defects of the semiconductor material 130 grown in other open regions (including the open region 122) formed in the insulating layer 110, which may not realize the benefits of reduced defects through ART.

As shown in FIG. 4, the epitaxy process continues until the high aspect ratio trenches 120 are filled, resulting in the formation of a plurality of fin structures 140 that are used to fabricate FinFET devices. More specifically, in one embodiment of the invention, the epitaxial deposition process is terminated at some point in the deposition process when (i) the high aspect ratio trenches 120 are over filled with the compound semiconductor material 130 (e.g., material of third layer 136) overgrown and protruding from the trenches 120 past a surface 110-1 of the insulating layer 110, and (ii) the open region 122 is partially filled with the compound semiconductor material 130. As further shown in FIG. 4, at the completion of the epitaxy process, a compound semiconductor structure 142 is formed in the open region 122, but the compound semiconductor structure 142 does not completely fill the open region 122. This results from the fact that the vertical growth rate of the compound semiconductor material 130 in the high aspect ratio trenches 120 is greater than the vertical growth rate of the same compound semiconductor material 130 in the wider open region 122 for the same epitaxial deposition time and number of epitaxial growth cycles. As such, when the trenches 120 are completely filled and overgrown with the compound semiconductor material 130, the larger open region 122 will only be partially filled with the compound semiconductor material 130.

Figure 5:
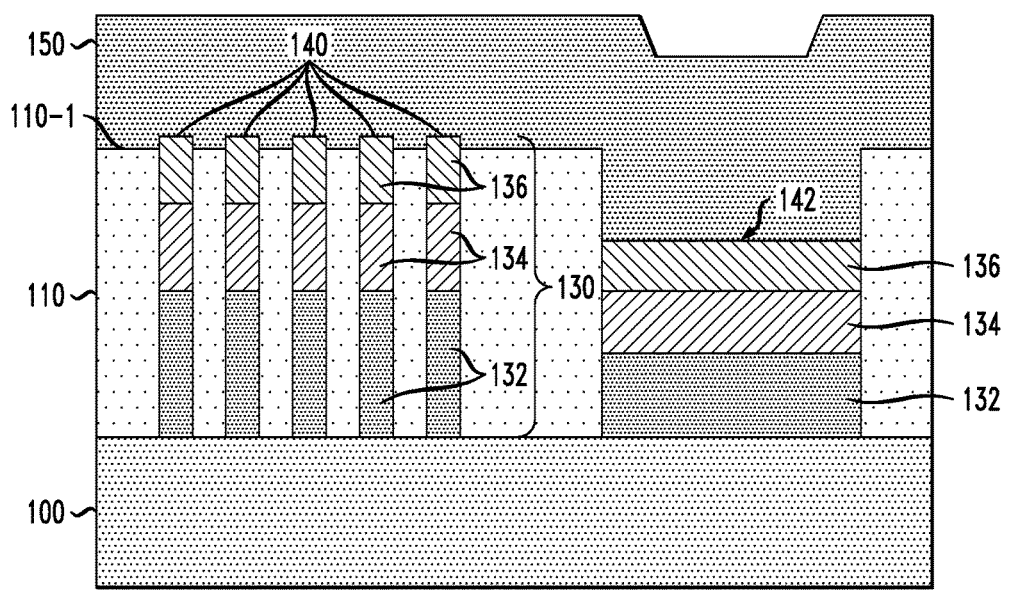
FIG. 5 is a cross-sectional schematic view of the semiconductor structure of FIG. 4 after depositing a layer of sacrificial material over the surface of the semiconductor structure, according to an embodiment of the invention.
Figure 6:
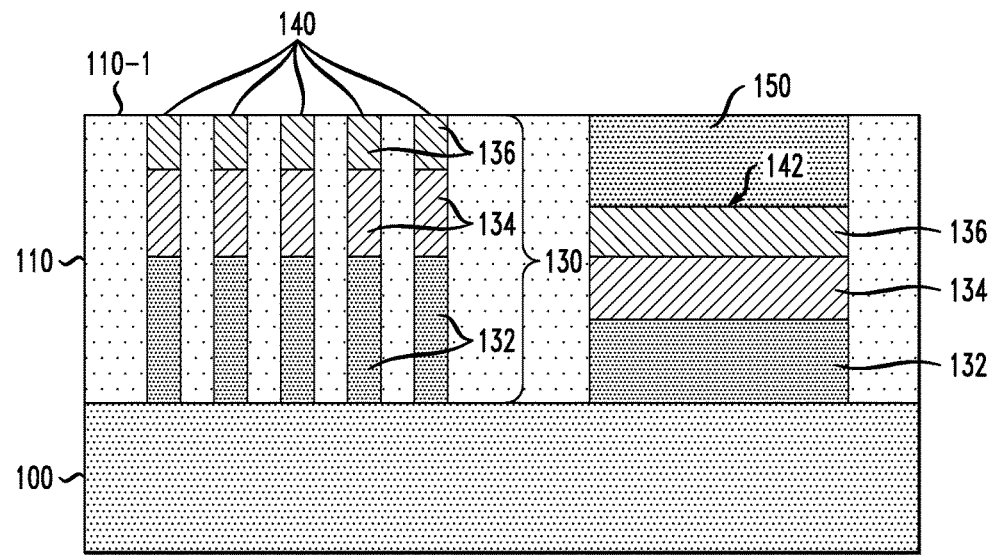
FIG. 6 is a cross-sectional schematic view of the semiconductor device of FIG. 5 after completion of a planarization process, according to an embodiment of the invention.

A next step in the fabrication process comprises planarizing the surface of the semiconductor structure (shown in FIG. 4) to be even with an upper surface 110-1 of the insulating layer 110. For example, FIGS. 5 and 6 schematically illustrate methods for planarizing the surface of the semiconductor structure of FIG. 4 according to embodiments of the invention. In general, a planarization process comprises depositing a layer of sacrificial material on the surface of the semiconductor structure shown in FIG. 4, followed by a CMP process to polish the semiconductor structure down to the insulating layer 110. More specifically, FIG. 5 is a cross-sectional schematic view of the semiconductor structure of FIG. 4 after depositing a layer of sacrificial material 150 on the surface of the semiconductor structure. As shown in FIG. 5, the sacrificial material 150 is deposited over the insulating layer 110 to cover the portion of the compound semiconductor material 130 protruding from the trenches 120, fill a remaining portion of the open region 122 with the sacrificial material 150, and to cover the surface 110-1 of the insulating layer 110.

In one embodiment of the invention, the sacrificial material 150 comprises a material that that can be etched (via a subsequent CMP process) (i) non-selective to the compound semiconductor material of the third layer 136 protruding from the trenches 120, and (ii) highly selective to the insulating material of the insulating layer 110. For example, the sacrificial material 150 can be a semiconductor material such as silicon germanium (SiGe) or germanium (Ge) (e.g., amorphous SiGe or Ge). In another embodiment of the invention, the sacrificial material 150 comprises an insulating or dielectric material such as SiN or some other insulating/dielectric material that can be etched selective to the insulating layer 110 and non-selective to the compound semiconductor material of the third layer 136 protruding from the trenches 120.

Following formation of the sacrificial layer 150, a planarization process is performed to planarize the surface of the semiconductor structure. For example, FIG. 6 is a cross-sectional schematic view of the semiconductor device of FIG. 5 after completion of the planarization process. As shown in FIG. 6, the semiconductor device is planarized down to the upper surface 110-1 of the insulating layer 110, resulting in removal of the sacrificial material 150 on the surface 110-1 of the insulating layer 110, as well as removal of the excess epitaxial material of the third layer 136 protruding from the trenches 120. This results in planarization of the upper surfaces of the compound semiconductor fin structures 140. As further shown in FIG. 6, following the planarization process, a portion of the sacrificial material 150 remains in the upper portion of the open region 122 above the semiconductor structure 142. Since the semiconductor material 130 in the open region 122 is not subjected to planarization, the upper surface of the third layer 136 of compound semiconductor material has a rough surface morphology, which results by virtue of the epitaxial deposition process.

In one embodiment of the invention, the planarization process is performed using a chemical mechanical polish (CMP) process. The CMP process utilizes a chemical slurry with a composition that is configured to etchably remove both the sacrificial material 150 and the excess epitaxial compound semiconductor material protruding from the trenches 120, highly selective (e.g., 10:1 or greater) to the material of the insulating layer 110.

The use of the sacrificial material 150 and subsequent CMP process according to an embodiment of the invention provides significant advantages and benefits over conventional schemes. For example, with reference to FIG. 4, in a conventional process, the epitaxial deposition process would not terminate at the state depicted in FIG. 4. Instead, the epitaxial deposition process would continue by epitaxially overgrowing the compound semiconductor material (e.g., third layer 136) both vertically and laterally to fill the trenches 120 and completely fill the open region 122, and cover the upper surface of the semiconductor structure (e.g., covering the insulating layer 110). Thereafter, a CMP process would be performed to planarize the surface of the semiconductor structure using a chemical slurry configured to etchably remove the excess epitaxial compound semiconductor material (e.g., overgrowth of epitaxial material of third layer 136) down to the upper surface 110-1 of the insulating layer 110.

With a conventional method as outlined above, there is a significant amount of excess epitaxial material that must be overgrown onto the surface of the insulating layer 110 to facilitate the CMP process. The formation of such excess epitaxial material is expensive in terms of the high cost of the III-V deposition gas usage, and the costs in terms of the added time and usage of the epitaxy tools/chambers needed to perform such process. In addition, since epitaxial growth is a relatively slow process, the fabrication process requires additional wasted time to grow the excess sacrificial epitaxial material, which only serves to facilitate the CMP process, and which is subsequently removed by the CMP process. Moreover, since III-V epitaxial material typically contains toxic materials such as arsenic (As), there is a significant amount of toxic gases and toxic liquid waste that is generated as a result of CMP removal of the excess epitaxial III-V material using the conventional method, which can adversely affect the environment. Moreover, the removal of such a large amount of excess epitaxial III-V material can result in contamination of other components/ regions of the semiconductor device being fabricated as well as contamination of the semiconductor fabrication tools.

In stark contrast to the conventional methods, the use of non-toxic sacrificial material 150 to facilitate the CMP process provides significant advantages in terms of reduced cost and an environmentally friendly CMP process. Indeed, as compared to the conventional process which requires overgrowing toxic III-V films to facilitate CMP, embodiments of the invention as discussed above (FIGS. 5 and 6) terminate the epitaxy process when the trenches 120 are just slightly overfilled (with a very small amount of II-V material protruding from the upper portions of the trenches 120), and then blanket deposit a non-toxic sacrificial material 150 to fill the remaining portion of the under filled open region 122 and form a layer of non-toxic sacrificial material which covers the insulating layer 110 to facilitate the CMP process. The use of the non-toxic sacrificial material 150 (such as amorphous semiconductor or dielectric materials) is significantly less expensive in terms of the material costs and other fabrication costs associated with depositing amorphous semiconductor or dielectric materials to form the sacrificial material layer 150, as opposed to using epitaxial III-V material as sacrificial material.

Moreover, since amorphous semiconductor or dielectric materials are non-toxic, the use of such materials as the sacrificial material 150 enables a more environmentally friendly CMP process, as opposed to using toxic epitaxial III-V materials as the sacrificial material for the CMP process. While a CMP process (FIG. 6) does result in the etching of excess epitaxial III-V material protruding from the trenches 120, the amount of such material is negligible as compared to the amount of excess epitaxial III-V material that is formed and CMP removed in the conventional process.

Following the planarizing process which results in the structure shown in FIG. 6, any standard sequence of processing steps can be implemented to complete the fabrication of n-type and/or p-type FinFET devices and other elements of an semiconductor integrated circuit being fabricated, the details of which are not needed to understand embodiments of the invention. However, for illustrative purposes, various processing steps that may be implemented subsequent to the planarization process of FIG. 6 will be generally discussed with reference to FIGS. 7, 8 and 9.

Figure 7:
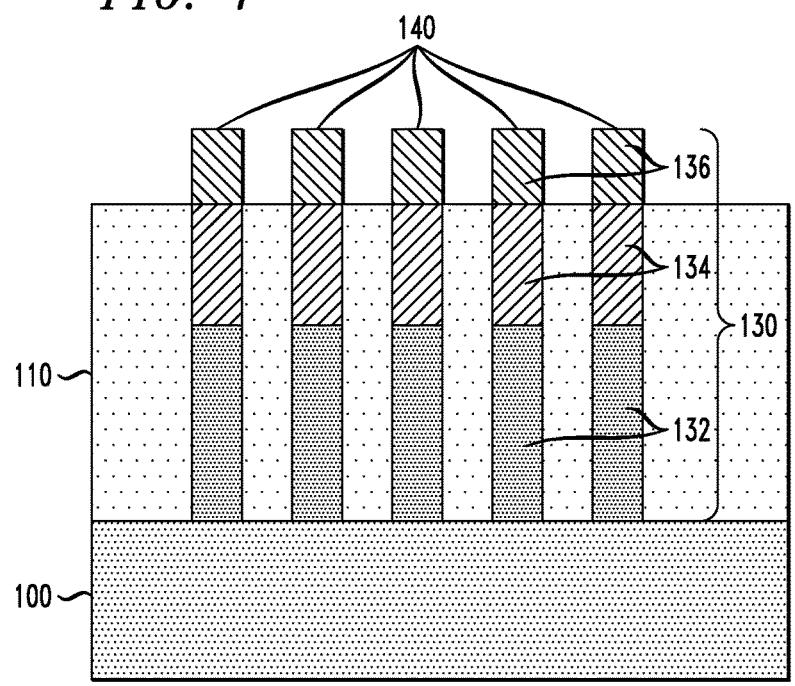
FIG. 7 is a cross-sectional schematic view of a portion of the semiconductor structure of FIG. 6 following etch back of the insulating layer to expose upper portions of compound semiconductor fin structures, according to an embodiment of the invention.

For example, a next step in the fabrication process comprises etching down the insulating layer 110 to expose upper portions of the fin structures 140, which define a baseline active fin height for the FinFET devices. For example, FIG. 7 is a cross-sectional schematic view of a portion of the semiconductor structure of FIG. 6 following etch back of the insulating layer 110 to expose the upper portions of the fin structures 140. In one embodiment of the invention, the insulating layer 110 can be selectively etched using RIE, although other etching processes may be employed. A timed etch can be performed to remove a desired amount of insulating material to expose the upper portion of the fin structures 140.

Figure 8:
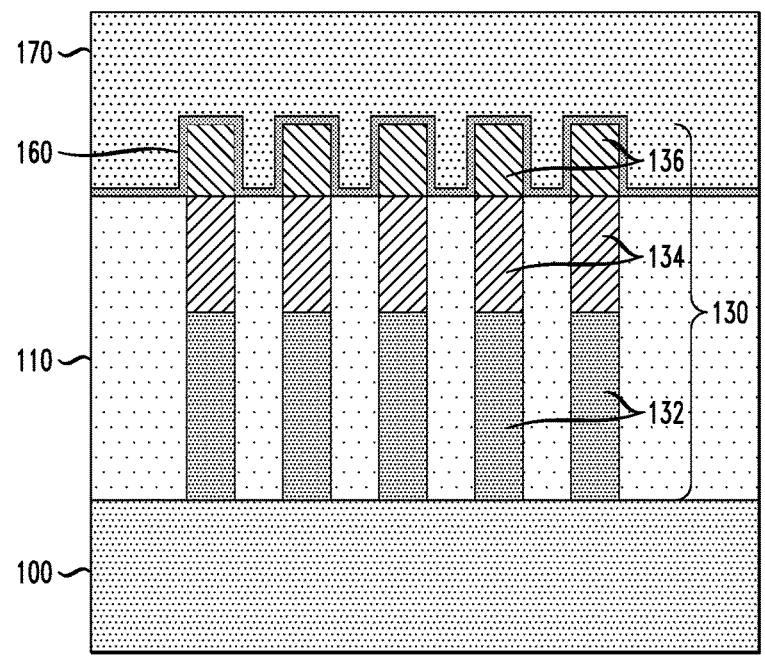
FIG. 8 is a cross-sectional schematic view of the semiconductor structure of FIG. 7 after forming a gate stack structure over exposed upper portions of the compound semiconductor fin structures, according to an embodiment of the invention.
Figure 9:
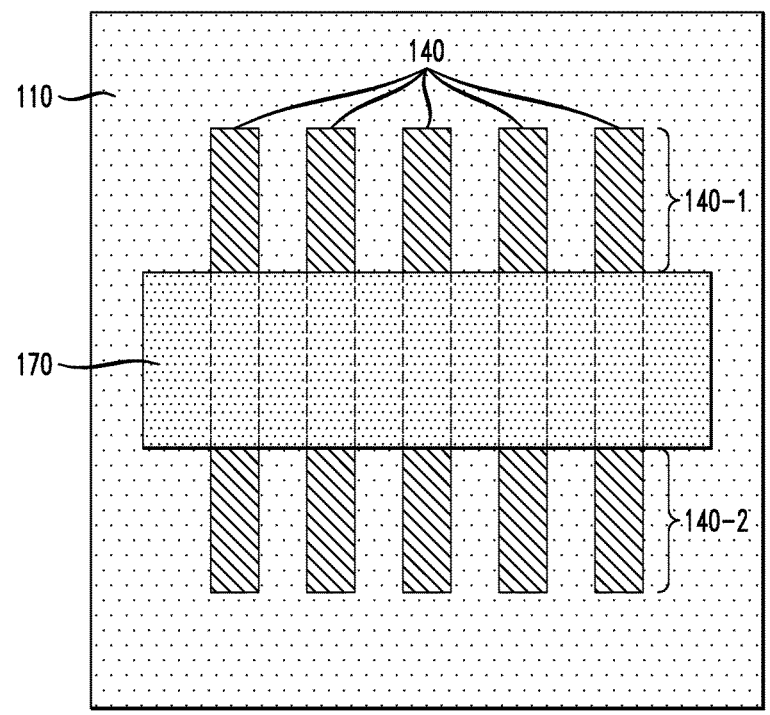
FIG. 9 is a top plan schematic view of the semiconductor structure of FIG. 9, according to an embodiment of the invention.

A next step in the process comprises forming one or more gate structures for the FinFET devices. FIGS. 8 and 9 schematically illustrate the semiconductor structure of FIG. 7 after forming a gate stack structure 160/170 over the semiconductor fin structures 140, according to an embodiment of the invention. The gate stack structure 160/170 comprises a conformal gate dielectric layer 160 and gate electrode structure 170 formed over a portion of the fin structures 140. FIG. 9 is a schematic top plan view of the structure shown in FIG. 8. As shown in FIG. 9. a portion 140-1 of the fin structures 140 extending from one side of the gate stack structure 160/170 are processed to formed source (or drain) regions, and a portion 140-2 of the fin structures 140 extending from an opposing side of the gate stack structure 160/170 are further processed to form drain (or source) regions.

The gate stack structure 160/170 can be formed using various techniques known in the art. For example, the gate stack structure 160/170 of the FinFETs can be formed using a "gate-first" process wherein the gate stack structure and spacers are formed prior to a selective epitaxial growth process, for example, wherein source and drain epitaxial structures are formed on the portions 140-1/140-2 of the fin structures 140. In a "gate-first" process, the gate stack structure 160/170 shown in FIG. 8 may be formed by depositing a conformal gate dielectric layer 160 over the semiconductor fin structures 140, depositing a metallic gate layer over the gate dielectric layer, depositing a dielectric/ insulating (capping) layer over the metallic gate layer, and then performing an etch process to pattern the gate stack structure 160/170. The gate dielectric 160 may be formed of materials such as high-dielectric constant (hi-K) material (e.g., $SiO_2$, SiON, $HfO_2$, etc.). The metallic gate layer may include a metal or metal compound, such as Cu, Al, W, TiN, etc. or alloys thereof. Alternatively, a doped semiconductor material may be employed. The capping layer may include SiN or other dielectric material.

In another embodiment, the gate stack structure 160/170 of the FinFETs can be formed using a "gate-last" process which involves, for example, forming dummy gate structures (e.g., polysilicon gates), fabricating other elements of the FinFET devices, removing the dummy gate structures, and replacing the removed dummy gate with actual gate materials. With this process, for example, the gate structure 170 would be a dummy gate structure formed of polysilicon, for example. The dummy gate structures are sacrificial structures that are subsequently removed and replaced by a replacement metal gate (RMG) potentially including a gate dielectric layer, a work function metal layer, and a metal electrode. Because the RMG structures are formed after the other components of the FinFET devices are formed, the RMG structures are not subjected to various potentially damaging processing steps, for example high-temperature anneals.

A next step in the exemplary process is to form source and drain structures on the exposed portions 140-1/140-2 of the fin structures 140 that are not covered by the gate stack structures 160/170. The source and drain structures can be formed using various techniques. For example, in one embodiment, the source and drain structures can be formed by doping the exposed portions 140-1/140-2 of the fin structures 140 using ion implantation techniques. In particular, for NFET devices, the source and drain structures can be formed by doping the exposed portions 140-1/140-2 of the semiconductor fin structures 140 with Group III elements (for PFET devices) or Group V elements (for NFET devices). Typical dopants include Boron, Arsenic, Phosphorus, Gallium, Antimony, etc. For example, boron is a p-type dopant, whereas Phosphorus is an n-type dopant.

In another embodiment of the invention, the source and drain structures can be doped using a solid phase diffusion method. With this process, a highly doped layer of semiconductor material is deposited over the exposed portions 140-1/140-2 of the fin structures 140, which is followed by a thermal anneal process to cause dopants to diffuse from the doped layer into the portions of the semiconductor fin structures covered by the doped layer.

In yet another embodiment, the source and drain structures can be formed by epitaxy, wherein a III-V compound material, or other suitable compound semiconductor materials are epitaxially grown on the exposed portions 140-1/140-2 of the fin structures 140. The source/drain structures can be grown epitaxially, and doped during the epitaxy process by adding impurities to the source gas, such as arsine, phosphine or diborane, for example, wherein the concentration of impurity in the gas phase determines its concentration in the deposited film. With this epitaxy process, a merging can occur, wherein epitaxial growth on the exposed portions 140-1 of the fin structures 140 can result in contact of adjacent source structures and epitaxial growth on the exposed portions 140-2 of the fin structures 140 can result in contact of adjacent drain structures. Following the formation of the source and drain structures any standard sequence of processing steps can be implemented to complete the fabrication of the n-type and/or p-type FinFET devices and other elements of the integrated circuit to be fabricated. Via contacts can be made to the source/drain/gate structures of the FinFET devices, followed by formation of an interconnect structure using BEOL (back end of line) processing techniques.

It is to be understood that the methods discussed herein can be incorporated in various semiconductor process flows to fabricate compound semiconductor devices (e.g., III-V devices) for integrated circuits with analog and digital circuitry or mixed-signal circuitry, wherein chemical mechanical polishing techniques are used to planarize substrate surfaces in which the compound semiconductor devices are formed based on aspect ratio trapping. In particular, integrated circuit dies can be fabricated with various devices such as FinFET devices, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method, comprising:
   forming an insulating layer on a semiconductor substrate, wherein the insulating layer comprises a trench and an open region formed in the insulating layer down to the semiconductor substrate;
   performing an epitaxial deposition process to deposit compound semiconductor material in the trench and in the open region of the insulating layer;
   terminating the epitaxial deposition process at some point in the deposition process when the trench is over filled with the compound semiconductor material, thereby forming excess compound semiconductor material protruding from the trench, and the open region is partially filled with the compound semiconductor material;
   depositing a layer of sacrificial material on the surface of the insulating layer to cover the excess compound semiconductor material protruding from the trench and to fill a remaining portion of the open region with the sacrificial material; and
   performing a CMP (chemical mechanical polishing) process to form a planarized surface by removing the sacrificial material on the surface of the insulating layer and removing the excess compound semiconductor material protruding from the trench.

2. The method of claim 1, wherein the CMP process is performed using a chemical slurry that etches the sacrificial material and the compound semiconductor material selective to the insulating layer.

3. The method of claim 1, wherein the compound semiconductor material comprises a III-V compound semiconductor material, wherein the III-V compound material comprises As (arsenic).

4. The method of claim 1, wherein the compound semiconductor material comprises a layer of GaAs (gallium arsenide) and a layer of InGaAs (Indium Gallium Arsenide).

5. The method of claim 1, wherein the sacrificial material comprises an amorphous semiconductor material.

6. The method of claim 1, wherein the sacrificial material comprises silicon germanium (SiGe) or germanium (Ge).

7. The method of claim 1, wherein the sacrificial material comprises a dielectric material.

8. The method of claim 7, wherein the dielectric material comprises silicon nitride.

9. The method of claim 1, wherein the compound semiconductor material in the trench comprises a fin structure of a FinFET device, and wherein the compound semiconductor material in the open region comprises one of a passive device and an isolation structure.

10. A semiconductor device, comprising:
an insulating layer disposed on a semiconductor substrate, wherein the insulating layer comprises a trench and an open region formed in the insulating layer down to the semiconductor substrate;
wherein the trench is filled with III-V compound semiconductor material that forms a fin structure of an FET (field effect transistor) device;
wherein one end of the fin structure contacts the semiconductor substrate and wherein another end of the fin structure extends past a surface of the insulating layer to provide an active fin component of the FET device formed on the surface of the insulating layer;
wherein a bottom portion of the open region is filled with III-V compound semiconductor material, in contact with the semiconductor substrate, wherein an upper portion of the open region is filled with as sacrificial material which comprises a non-III-V semiconductor material; and
wherein the III-V compound semiconductor materials in the trench and the open region of the insulating layer are the same.

11. The semiconductor device of claim 10, wherein the III-V compound semiconductor material in the open region composes one of a passive device and an isolation structure.

12. The semiconductor device of claim 10, wherein the sacrificial material filling the upper portion of the open region in the insulating layer comprises an amorphous semiconductor material.

13. The semiconductor device of claim 10, wherein the sacrificial material filling the upper portion of the open region in the insulating layer comprises a dielectric material.

14. The semiconductor device of claim 13, wherein the dielectric material comprises silicon nitride.

15. The semiconductor device of claim 10, wherein the sacrificial material filling the upper portion of the open region in the insulating layer comprises silicon germanium (SiGe) or germanium (Ge).

16. The semiconductor device of claim 10, wherein the III-V compound semiconductor material that forms the fin structure comprises As (arsenic).

17. The semiconductor device of claim 10, wherein the III-V compound semiconductor material that fills the trench comprises:
a first layer of III-V compound semiconductor material formed on the semiconductor substrate;
a second layer of III-V compound semiconductor material formed on the first layer of III-V compound semiconductor material; and
a third layer of III-V compound semiconductor material formed on the second layer of III-V compound semiconductor material.

18. The semiconductor device of claim 17, wherein the first layer of III-V compound semiconductor material comprises GaAs (Gallium Arsenide), wherein the second layer of III-V compound semiconductor material comprises InP (Indium Phosphide), and wherein the third layer of III-V compound semiconductor material comprises InGaAs (Indium Gallium Arsenide).

19. The semiconductor device of claim 17, wherein the first layer of III-V compound semiconductor material comprises GaAs (Gallium Arsenide), wherein the second layer of III-V compound semiconductor material comprises a first composition of InGaAs (Indium Gallium Arsenide), and wherein the third layer of III-V compound semiconductor material comprises a second composition of InGaAs, which is different from the first composition of InGaAs.

20. The semiconductor device of claim 17, wherein the first and second layers of III-V compound semiconductor material comprise a graded buffer structure that serves to match a lattice constant of material of the semiconductor substrate to a lattice constant of the third layer of III-V compound semiconductor material.

* * * * *